United States Patent
Rijo Da Costa Carvalho et al.

(10) Patent No.: US 11,332,588 B2
(45) Date of Patent: May 17, 2022

(54) PROCESS FOR MODIFICATION OF A SOLID SURFACE

(71) Applicant: SURFIX B.V., Wageningen (NL)

(72) Inventors: Rui Pedro Rijo Da Costa Carvalho, Wageningen (NL); Janneke Veerbeek, Wageningen (NL); Johannes Teunis Zuilhof, Wageningen (NL); Wout Knoben, Wageningen (NL); Luc Maria Wilhelmus Scheres, Wageningen (NL)

(73) Assignee: SURFIX B.V., Wageningen (NL)

( * ) Notice: Subject to any disclaimer, the term of this patent is extended or adjusted under 35 U.S.C. 154(b) by 0 days.

(21) Appl. No.: 16/967,858

(22) PCT Filed: Feb. 8, 2019

(86) PCT No.: PCT/EP2019/053088
§ 371 (c)(1),
(2) Date: Aug. 6, 2020

(87) PCT Pub. No.: WO2019/154962
PCT Pub. Date: Aug. 15, 2019

(65) Prior Publication Data
US 2021/0032427 A1    Feb. 4, 2021

(30) Foreign Application Priority Data

Feb. 8, 2018 (EP) .................................. 18155694

(51) Int. Cl.
| | |
|---|---|
| C08J 7/12 | (2006.01) |
| B01L 3/00 | (2006.01) |
| C08G 77/442 | (2006.01) |
| G03F 7/028 | (2006.01) |
| G03F 7/20 | (2006.01) |
| B82Y 30/00 | (2011.01) |
| B82Y 40/00 | (2011.01) |

(52) U.S. Cl.
CPC ......... C08J 7/123 (2013.01); B01L 3/502707 (2013.01); C08G 77/442 (2013.01); G03F 7/028 (2013.01); G03F 7/2002 (2013.01); B82Y 30/00 (2013.01); B82Y 40/00 (2013.01); *C08J 2383/05* (2013.01)

(58) Field of Classification Search
CPC ... C08G 77/442; C08J 17/123; C08J 2383/05; G03F 7/028; G03F 7/0755; G03F 7/2002; G03F 7/2004; B01L 3/502707; B01L 2200/12; B01L 2300/0816; B01L 2300/12; B01L 2300/16; B82Y 30/00; B82Y 40/00
See application file for complete search history.

(56) References Cited

U.S. PATENT DOCUMENTS

| | | | |
|---|---|---|---|
| 5,429,708 A | 7/1995 | Linford et al. | |
| 6,331,329 B1 | 12/2001 | McCarthy et al. | |
| 6,524,655 B2 | 2/2003 | McCarthy et al. | |
| 6,673,459 B2 | 1/2004 | McCarthy et al. | |
| 8,221,879 B2 | 7/2012 | Zuilhof et al. | |
| 8,481,435 B2 | 7/2013 | Schroen et al. | |
| 8,993,479 B2 | 3/2015 | Zuilhof et al. | |
| 2009/0286157 A1* | 11/2009 | Chen | H01M 10/052 |
| | | | 429/209 |
| 2011/0251059 A1* | 10/2011 | Zuilhof | C03C 17/28 |
| | | | 502/439 |
| 2017/0022223 A1* | 1/2017 | Nakanishi | C09C 1/3081 |
| 2017/0297018 A1* | 10/2017 | Rijo da Costa Carvalho | |
| | | | G03F 7/0755 |

FOREIGN PATENT DOCUMENTS

| | | |
|---|---|---|
| EP | 3207992 A1 | 8/2017 |
| WO | 2015136913 A1 | 9/2015 |

OTHER PUBLICATIONS

Yosuke Tsuzuki, Yuta Oikubo, Yoshinari Matsuura, Kiyoshi Itatani, Seiichiro Koda, Vacuum ultraviolet irradiation on siliceous coatings on polycarbonate substrates, J Sol-Gel Sci Technol (2008) 47:131-139 (Year: 2008).*
LUDOX® Colloidal Silica in Catalyst Applications brochure May 12, 2015 (Year: 2015).*
Jorge Escorihuela and Han Zuilhof, Rapid Surface Functionalization of Hydrogen-Terminated Silicon by Alkyl Silanols, J. Am. Chem. Soc. 2017, 139, 5870-5876. (Year: 2017).*
Helmy, R., Reaction of Organosilicon Hydrides with Solid Surfaces: An Example of Surface-Catalyzed Self-Assembly, J. Am. Chem. Soc, 2004, vol. 126, pp. 7595-7600.
Carvalho, R., Local Light-Induced Modification of the Inside of Microfluidic Glass Chips, Langmuir, 2016, vol. 32, pp. 2389-2398, American Chemical Society.
Steindl, J., Silane-Acrylate Chemistry for Regulating Network Formation in Radical Photopolymerization, Macromolecules, 2017, vol. 50, pp. 7448-7457, American Chemical Society.
Lalevee, J., Silanes as New Highly Efficient Co-initiators for Radical Polymerization in Aerated Media, Macromolecules, 2008, vol. 41, pp. 2003-2010, American Chemical Society.
Moitra, N., Surface Functionalization of Silica by Si—H Activation of Hydrosilanes, Journal of the American Chemical Society, 2014, vol. 136, pp. 11570-11573, ACS Publications.

* cited by examiner

*Primary Examiner* — Bijan Ahvazi
(74) *Attorney, Agent, or Firm* — Hudak, Shunk & Farine Co. LPA

(57) ABSTRACT

A process for the modification of a surface of a solid material having the step of contacting the surface with a surface-modifying composition under irradiation with light of a wavelength in the range of 200 to 800 nm, optionally in the presence of a photoinitiator, wherein the solid material is chosen from the group consisting of polyesters, polyethers, polycarbonates, polyketones polyamides, polyurethanes, (meth)acrylate and (meth)acrylamide polymers and polyetherimides and wherein the surface modifying composition includes at least a hydrosilane.

22 Claims, No Drawings

PROCESS FOR MODIFICATION OF A SOLID SURFACE

FIELD OF THE INVENTION

The present invention relates to a process for the modification of a surface of a solid material. The present invention further relates to the surface-modified solid material obtainable by such process and its applications.

BACKGROUND OF THE INVENTION

Surface modification plays an important role in micro- and nanotechnology, as it provides materials and devices with essential properties such as biorecognition, antifouling, and/or (anti)wetting. For many applications it is beneficial to have local control of these properties, i.e. patterns of different functionalities on the surface. Examples include biosensors, microfluidics and substrates for microarrays or cell studies. However, using well-known surface modification technologies such as self-assembled monolayers of (chloro- or alkoxy)silanes or thiols, patterning can only be achieved by complex and time-consuming lithographic processes.

For the preparation of patterned surfaces, a photochemical surface modification method is desirable, as this allows direct constructive patterning by radiating the substrate through a photomask. Several alternative methods for photochemical surface modification are known. For example, light-initiated formation of organic monolayers of alkenes and alkynes on H-terminated (etched) silicon is known from U.S. Pat. No. 5,429,708. Later, it was found that also other etched silicon (and germanium) based materials such as $Si_3N_4$ and SiC could be modified in a similar way, as described in U.S. Pat. Nos. 8,481,435 and 8,221,879. Also, it has been shown in U.S. Pat. No. 8,993,479 that alkenes/alkynes can be photochemically attached to hydroxyl-terminated surfaces (e.g. glass).

Even though these methods are useful for preparing patterned surfaces, there are several drawbacks to the photochemical surface modification by alkene/alkyne monolayers. Most importantly, the preparation of high-quality monolayers is slow (more than 10 hours), thus limiting the practical applicability of the method. Further these modifications should be carried out in the absence of $O_2$ and $H_2O$, which reduces the practical application of this method. Moreover, modification of oxide surfaces in the absence of a photoinitiator requires UV radiation at wavelengths of less than 275 nm (typically 254 nm is used), which can cause compatibility issues with biomolecules and substrate materials.

Recently, a two-step surface modification route was reported, allowing light with a longer wavelength (302 nm) to be used for the formation of alkene monolayers on hydrogen-terminated glass (H-glass) (R. Rijo Carvalho, S. P. Pujari, S. C. Lange, R. Sen, E. X. Vrouwe, and H. Zuilhof, "Local Light-Induced Modification of the Inside of Microfluidic Glass Chips", Langmuir 32 (2016) 2389-2398). However, the introduction of Si—H groups at the surface requires an extra step and thus adds complexity. Moreover, the reaction of the alkene is slow and takes 16 h.

Surface modification using hydrosilanes (also referred to as hydridosilanes or silicon hydrides) has been proposed as an alternative to conventional chloro- or alkoxysilane-based methods. Hydrosilanes are more stable in ambient conditions and therefore easier to purify and handle. Moreover, they are compatible with a wider range of terminal functional groups. Hydrosilane layers have been prepared on various metal oxide surfaces, as described in U.S. Pat. Nos. 6,331,329, 6,524,655 and 6,673,459. However, long reaction times at elevated temperature are required to obtain high-quality layers. Moreover, it was found that the metal oxide surface plays a catalytic role and therefore hydrosilanes are found not to react with non-metal surfaces such as $SiO_2$, carbon black and organic polymers at room temperature (R. Helmy, R. W. Wenslow, and A. Y. Fadeev, "Reaction of Organosilicon Hydrides with Solid Surfaces: An example of Surface-Catalyzed Self-Assembly", J. Am. Chem. Soc. 126 (2004) 7595-7600).

WO2015136913 discloses a method for producing a surface-modified substrate which includes a step for bringing into contact, in the presence of a borane catalyst, a substrate having polar groups present on the surface thereof and a hydrosilane compound having an Si—H group in which a hydrogen atom is bonded to a silicon atom, and causing a dehydrogenation condensation reaction to advance between the substrate and the compound, thereby forming a substrate having a modified surface. Using this approach, modification of silica surfaces can be achieved in a few minutes at room temperature. However, since the reaction requires a homogeneous catalyst, surface modification takes place on the whole surface and results only in very thin monolayer type layers with thicknesses in the range of 1-2 nm. The method is therefore not suitable for the preparation of patterned layers and optionally thicker surface modification layers, for example between 2 and 500 nm.

The method is therefore not suitable for the preparation of patterned layers.

The same authors filed a paper in the J. Am. Chem. Soc 2014, 136, 11570-11573 on the surface modification of silica catalytic activation of Si—H bonds of hydrosilanes.

Outside the field of chemical surface modification, the use of certain hydrosilanes in bulk radical photopolymerization processes has been described. Macromolecules 2017, 50, 7448-7457 describes silane-acrylate chemistry toward spatially resolved organosilicon compounds. In this publication bulk polymeric networks are synthesized (at 0.5 wt. % photoinitiator concentration). Use is made of organosilicon compounds having two Si—H groups, each surrounded by two bulky trimethylsilyl groups, which act as chain transfer agent during polymerization. Solely examples of bulk polymerization are given, but such a bulk polymerization process is not suitable for the surface modification of substrates. No examples are given for the chemical surface coupling of hydrosilanes and/or for surface modification of substrates and/or change of surface properties of substrates.

Macromolecules 2008, 41, 2003-2010 discloses a number of hydrosilanes as co-initiators for radical bulk polymerization in aerated media. Solely examples of bulk polymerization of diacrylates, by exciting the photoinitiator (1.0 wt. %), are given. No examples are given for the chemical surface coupling of hydrosilanes and/or for surface modification of substrates and/or change of surface properties of substrates.

SUMMARY OF THE INVENTION

There is therefore a need for the development of improved photochemical surface modification methods. The improvements may be a reproducible, light-induced reaction with short reaction times using a surface-modifying compound with a low optical density. Other improvements may be a large contrast between modified and non-modified surfaces and a good lateral resolution when irradiated locally by means of a photomask.

The invention provides a process for the modification of a surface of a solid material, comprising the step of contacting the surface with a surface-modifying composition under irradiation with light of a wavelength in the range of 200 to 800 nm optionally in the presence of a photoinitiator, wherein the solid material is chosen from the group consisting of polyesters, polyethers, polycarbonates, polyketones polyamides, polyurethanes, (meth)acrylate and (meth)acrylamide polymers and polyetherimides and wherein the surface-modifying composition comprises at least a hydrosilane. The modification of the surface of the solid material can be performed without the application of an additional primer or adhesion promotor to the surface in order to improve the adhesion of the surface modification layer.

It is believed that the hydrogen atom bonded to the silicon atom of the hydrosilane gives rise to a photoinitiated chemical surface coupling reaction with the C=O or C—O—C groups on the surface of the solid material. It is believed that a photoactivation takes place of the Si—H bond of the hydrosilanes close to the surface of the substrate. The activated hydrosilane reacts with the surface of the substrate thereby forming a locally modified surface.

DETAILED DESCRIPTION OF THE INVENTION

The process according to the invention provides a number of improvements over known methods for chemical surface modification, in particular in comparison with the process described in WO2015136913. In the process of WO2015136913, a homogeneous catalyst is required, only very thin molecular monolayers can be made and surface modification takes place on the whole surface (not allowing for pattern formation). Moreover, the process only works on HO—Si surfaces (since it can yield C—OH, —SH, —C=C, —COOH terminated monolayers), and does not work on other substrates.

It was surprisingly found that a surface modification can be carried out on a variety of different substrate materials. In particular, a surface modification involving a dehydrogenation reaction was found to take place at room temperature in the absence of a catalyst, by performing the contacting step under irradiation with light. This is particularly surprising in view of the fact that a dehydrogenation reaction was known not to occur between hydrosilanes and non-metal surfaces at room temperature, as described in J. Am. Chem. Soc. 126 (2004) 7595-7600. The process according to the invention further advantageously allows the surface modification to be performed locally and within a short time.

The process according to the invention is catalyst free and allows a spatially selective surface modification by use of a mask, for example a photomask. Accordingly, in some preferred embodiments of the process of the invention, a predetermined part of the surface is selectively subjected to the irradiation. Preferably, a photomask or a mask that may be in direct contact with the solid material selectively blocks a predetermined part of the surface from being irradiated, resulting in selective modification of that part of the surface that is not blocked by the mask, i.e. patterning of the surface.

The ability to perform a photochemical surface modification according to the invention enables the patterning of said surface. In a further preferred embodiment, the process according to the invention is applied for the selective modification, with a predetermined pattern, of the surface of spatially confined microchannels on or below the surface of a solid material. Thus in one embodiment the modified surface is the surface of spatially confined microchannels, on and/or under the outer surface of the solid material.

Despite the low molar absorption coefficients of the hydrosilanes, providing a low optical density, the reaction times are surprisingly short compared to reaction times for known photochemical surface modification methods (e.g. the process described in U.S. Pat. No. 8,993,479), even without a photoinitiator.

The process according to the invention comprises the step of contacting the surface with a surface-modifying composition under irradiation with light of a wavelength in the range of 200 to 800 nm, optionally in the presence of a photoinitiator.

Irradiation

The contacting of the solid material and the surface-modifying composition is carried out under irradiation with light of a wavelength in the range of 200 to 800 nm. This may be carried out in the presence of a photoinitiator or in the absence of a photoinitiator. The presence of a photoinitiator is suitable for initiating or accelerating the reaction when necessary, provided that the optical density of the surface-modifying composition remains low. This is required in order to minimize internal filtering effects and bulk polymerization, which may prevent photochemical surface coupling to take place. For example, when the light has a wavelength in the range of 300 to 800 nm, the irradiation is preferably carried out in the presence of a photoinitiator.

In some preferred embodiments of the invention, the irradiation is carried out in the absence of a photoinitiator and the light has a wavelength in the range of 260 nm to 300 nm, more preferably 280 nm to 300 nm. This advantageously avoids compatibility issues with biomolecules and substrate materials.

In some preferred embodiments of the invention, the irradiation is carried out in the presence of a photoinitiator and under irradiation with light of a wavelength in the range of 300 to 800 nm, preferably with a wavelength lower than 700 nm, or lower than 600 nm, or lower than 500 nm, or lower than 400 nm, more preferably lower than 380 nm, even more preferably lower than 350 nm and in particular lower than 330 nm.

Depending on the type of the surface-modifying composition and the surface, desirable results may also be obtained by irradiation with light having a wavelength in the range of 300 to 800 nm in the absence of a photoinitiator.

Examples of suitable photoinitiators include, but are not limited to alkyl bromides, benzyl iodides, 2,2-dimethoxy-2-phenyl acetophenone, benzophenone and the like. The amount of photoinitiator present in the reaction mixture may be in the range of 0.01 to 5.0 wt. %, more preferably in the range of 0.01 to 3 wt. %, even more preferably in the range of 0.01 to 2 wt. %, and in particular in the range of 0.01 to 1 wt. %, relative to the surface-modifying compound.

The surface modifying composition can be contacted with the solid material by different deposition methods, e.g, pipetting, dipcoating, spraycoating, or spincoating.

The process according to the present invention is applicable to various types of solid materials. A solid material is defined as a material that is in the solid state at ambient temperature, e.g. 20° C.

The process according to the present invention may be applied on various different types of surfaces, both planar and curved, and examples comprise particles (e.g. micro- or nanoparticles), powders, crystals, films or foils.

Solid Material

The solid material is chosen from the group consisting of polyesters, polyethers, polycarbonates, polyketones, polyamides, polyurethanes, (meth)acrylate and (meth)acrylamide polymers, and polyetherimides.

Pretreatment of Surface

In some embodiments, the process comprises the step of treating the surface to have micro- and/or nanoscale surface roughness before the irradiation step. This can be realized in many ways, e.g. casting (nano)particle solutions, sol-gel processes, and chemical vapour deposition (CVD) to prepare roughness in the order of micro- and nanometers on the surface.

By introducing a certain degree of roughness to an already hydrophilic surface, the surface may become superhydrophilic, i.e. the surface has a water contact angle of less than 10°, more preferably less than 5°. If such a superhydrophilic surface is treated with a hydrophobic surface-modifying composition in the irradiation step according to the invention, the irradiated surface may become very hydrophobic, i.e. the irradiated surface has a water contact angle of more than 140°, more preferably superhydrophobic having a water contact angle of more than 150°. Thus, a very large wettability contrast can be obtained between irradiated and non-irradiated surfaces.

The step of introducing micro- and/or nanoscale surface roughness may also improve other surface properties, like increased immobilisation of biomolecules and improved antifouling properties, by increasing the amount of surface-bound molecules.

Hydrosilane

A hydrosilane is a molecule containing at least one hydrosilyl group. A hydrosilyl group is a group containing a silicon atom and at least one hydrogen atom bonded to Si. The Si—H is called a silicon hydride. When one H is bonded to Si, it is a silicon monohydride. A silicon dihydride is a Si atom bonded to two hydrogen atoms (Si—H$_2$), while a silicon trihydride is a Si-atom bonded to three hydrogen atoms (Si—H$_3$).

A hydrosilane with a single hydrosilyl group may be represented by

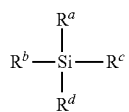

where at least one of $R^a$, $R^b$, $R^c$, and $R^d$ is H and at least one of $R^a$, $R^b$, $R^c$, and $R^d$ is not H, where each of $R^a$, $R^b$, $R^c$, and $R^d$ is, independently, H, optionally substituted $C_{1-30}$ alkyl, optionally substituted $C_{2-30}$ alkenyl, optionally substituted $C_{2-30}$ alkynyl, optionally substituted $C_{6-20}$ aralkyl, optionally substituted $C_{6-10}$ aryl, or a polymeric moiety having a molecular weight of about 1000 to about 100,000.

The polymeric moiety is selected from the group consisting of hydrocarbon polymers, polyesters, polyamides, polyethers, polyacrylates, polyurethanes, epoxides, polymethacrylates and polysiloxanes (e.g. poly(methylhydrosiloxane)). Each of $R^a$, $R^b$, $R^c$, and $R^d$ is optionally substituted with one or more substituents selected from the group consisting of —F, —Cl, —Br, —CN, —NO$_2$, =O, —N=C=O, —N=C=S, epoxy, thioether, —N$_3$, —NR$^e$R$^f$, —SR$^g$, —OR$^h$, —CO$_2$R$^i$, —PR$^j$R$^k$R$^l$, —P(OR$^m$)(OR$^n$)(OR$^p$), —P(=O)(OR$^q$)(OR$^s$), —P(=O)$_2$OR$^t$, —OP(=O)$_2$OR$^u$, —S(=O)$_2$R$^v$, —S(=O)R$^w$, —S(=O)$_2$OR$^x$, —C(=O)NR$^y$R$^z$. Each of R$^e$, R$^f$, R$^g$, R$^h$, R$^i$, R$^j$, R$^k$, R$^l$, R$^m$, R$^n$, R$^p$, R$^q$, R$^s$, R$^t$, R$^u$, R$^v$, R$^w$, R$^x$, R$^y$, and R$^z$, is, independently, H, linear $C_{1-10}$ alkyl, branched $C_{1-10}$ alkyl, cyclic $C_{3-8}$ alkyl, linear $C_{2-10}$ alkenyl, branched $C_{2-10}$ alkenyl, linear $C_{2-10}$ alkynyl, branched $C_{2-10}$ alkynyl, $C_{6-12}$ aralkyl, or $C_{6-10}$ aryl, and is optionally substituted with one or more substituents selected from the group consisting of —F, —Cl, and —Br.

Preferred examples of the hydrosilanes include compounds represented by

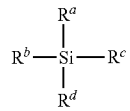

where at least one of $R^a$, $R^b$, $R^c$, and $R^d$ is H, at least one (preferably one) of $R^a$, $R^b$, $R^c$, and $R^d$ is a group represented by the formula selected from the following list A and the remaining $R^a$, $R^b$, $R^c$, and $R^d$ is independently chosen from the groups as described above (e.g. $C_1$-$C_{30}$ alkyl), wherein the list A consists of:

100)

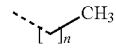

101)

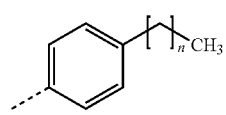

110)

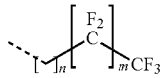

111)

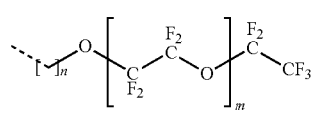

112)

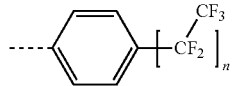

113)

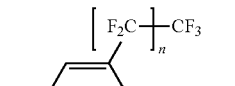

120)

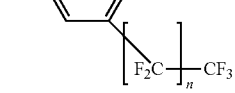

121)

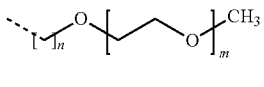

130)

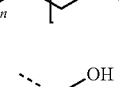

131) 
132) 
133) 
134) 
135) 
136) 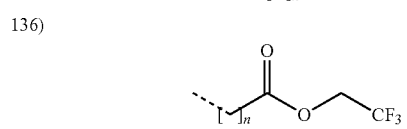
137) 
138) 
139) 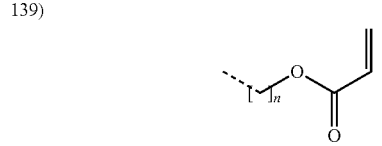
140) 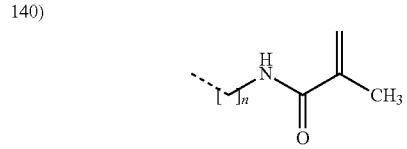
150) 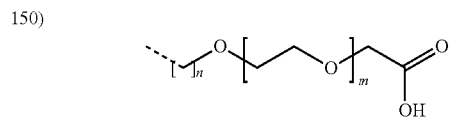
151) 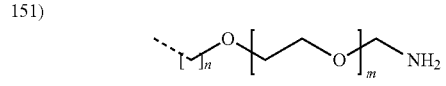
152) 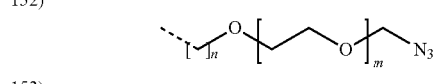
153) 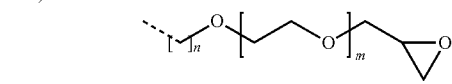
154) 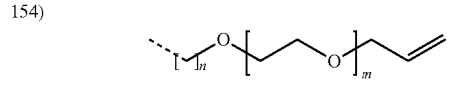
155) 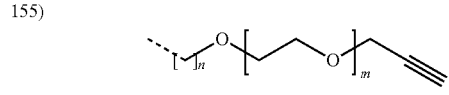
160) 
161) 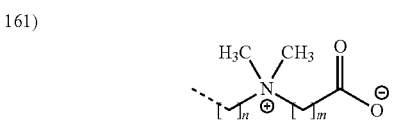
162) 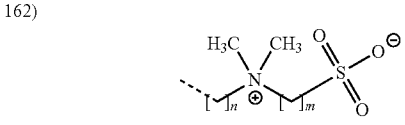
163) 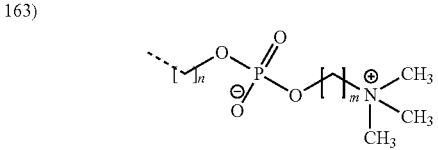
with all n = 1-20
and all m = 1-1000
170) 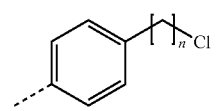
171) 
172) 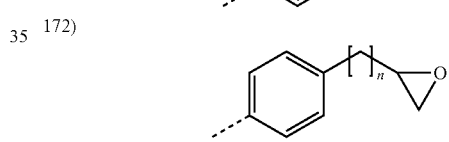
173) 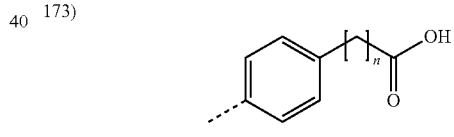
174) 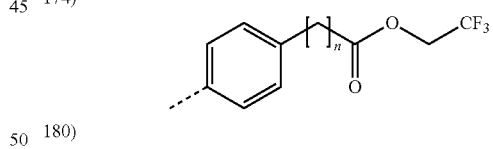
180) 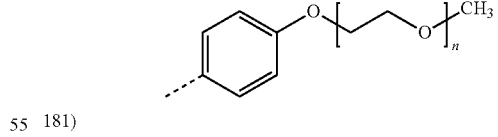
181) 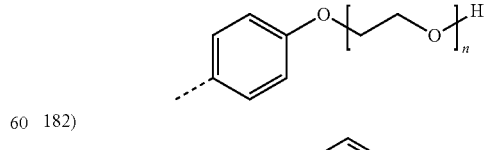
182) 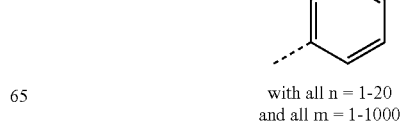
with all n = 1-20
and all m = 1-1000

182) 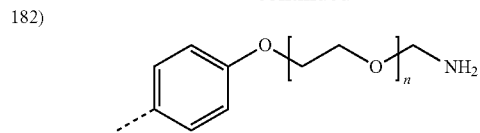

183) 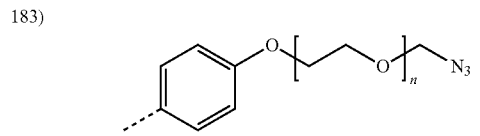

190) 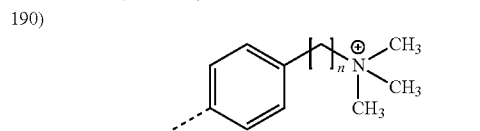

191) 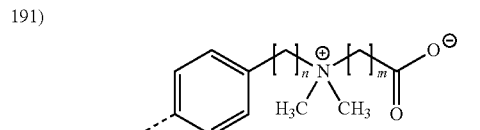

192) 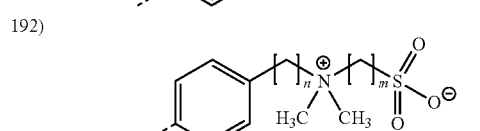

193) 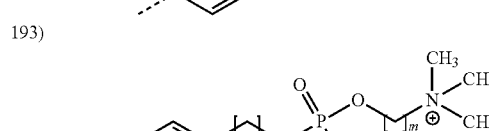

194) 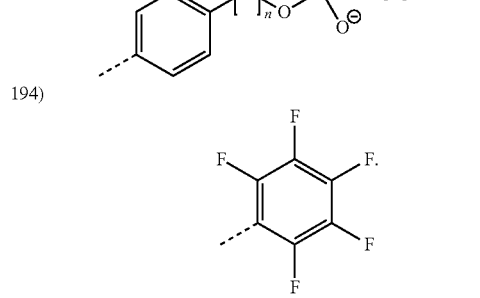

For the avoidance of doubt, it is noted that these groups are bonded to another element by the dashed line (- - -). Accordingly, for example, the group

is bonded to Si as Si—$CH_2CH_3$ when n is 1 and Si—$(CH_2)_5$$CH_3$ when n is 5.

The hydrosilane can have a single hydrosilyl group or more than one hydrosilyl group, for example 2, 3, 4, or even more hydrosilyl groups, each having at least one silicon monohydride (Si—H), silicon dihydride (Si—$H_2$) or even silicon trihydride (Si—$H_3$).

Preferably the hydrosilane has one or more hydrosilyl groups, each having at least one silicon monohydride (Si—H) or silicon dihydrides (Si—$H_2$) or silicon trihydrides (Si—$H_3$).

A specific example of a compound having multiple hydrosilyl groups is octakis(hydrodimethylsiloxy)octasilsesquioxane.

Other specific examples of compounds having at least two hydrosilyl groups are

200) 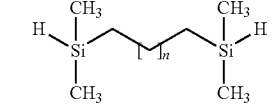

201) 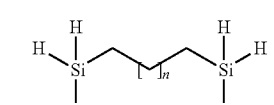

202) 

210) 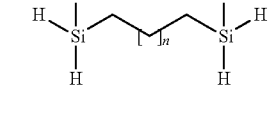

211) 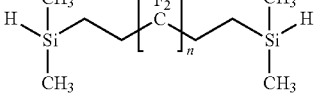

212) 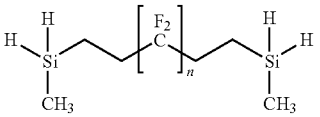

220) 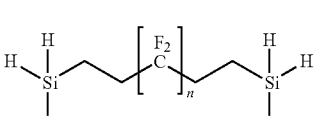

221) 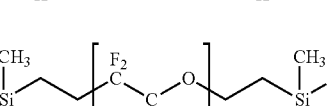

222) 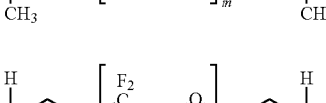

230) 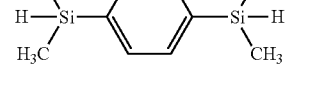

231) 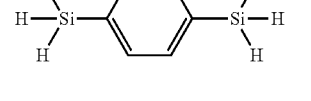

232) 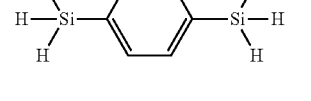

-continued
240)
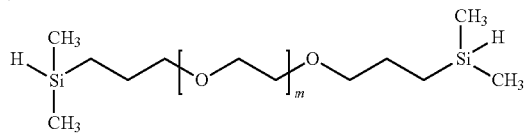
241)
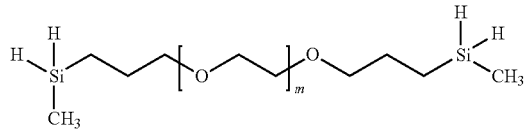
242)
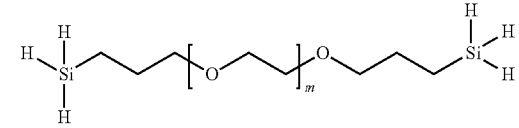
250)
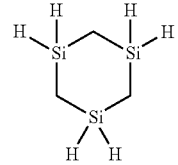
251)
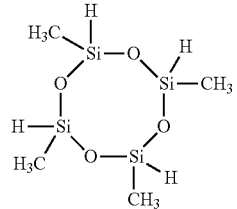
252)
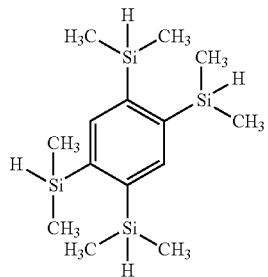
253)
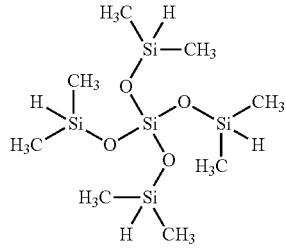
254
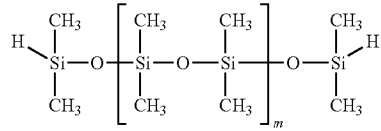
-continued
255)
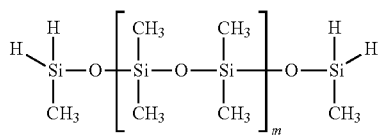
256
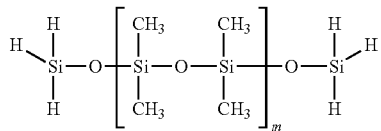
with all n = 1-20
and all m = 1-1000
260)
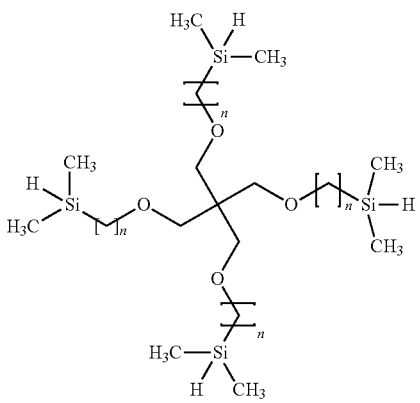
with all n = 1-20
and all m = 1=1000
261)
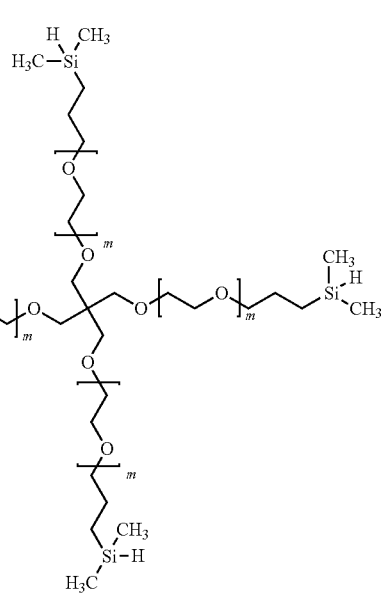

262)

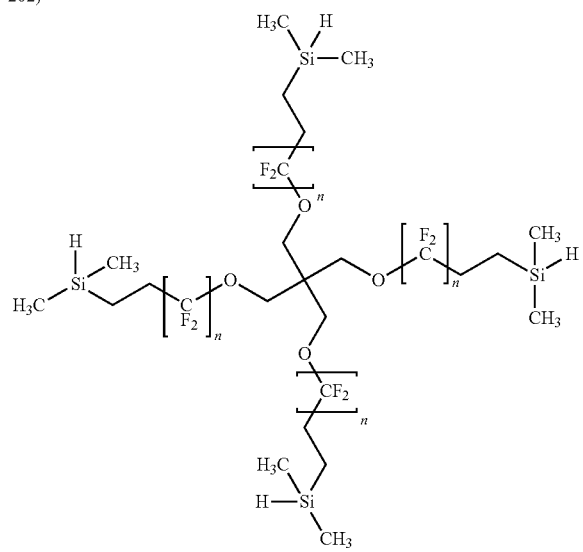

263)

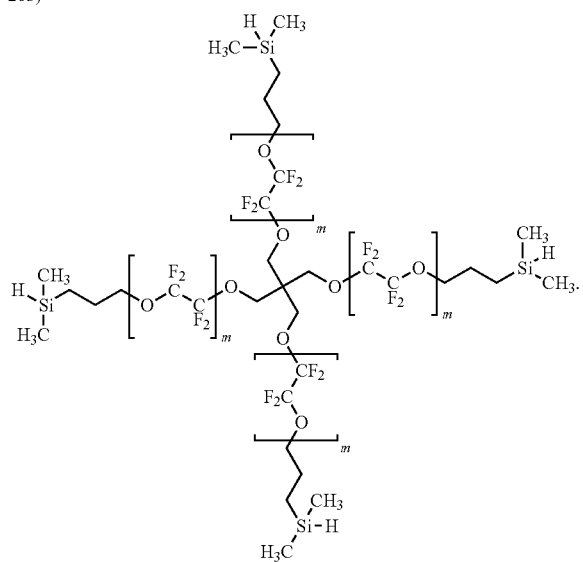

In all formulas 100-263 n ranges between 1 and 20 and m ranges between 1 and 1000.

Preferably n ranges between 1 and 18, more preferably between 1 and 16 or 1 and 12

Preferably m ranges between 5 and 500, or more preferably between 10 and 400.

The number of silicon hydrides in the hydrosilane determines the time required for the reaction to be completed and the selectivity of the reaction to the irradiated area (contrast and resolution). Regarding the selectivity, the two important parameters for the patterned surfaces according to the invention are:

1) (chemical) contrast—(maximum) difference in effectiveness of the surface modification reaction. For a hydrophobicity-inducing surface modification this is e.g. measured by the difference in water contact angle (WCA) between the irradiated and non-irradiated areas. For a hydrophilicity-inducing surface modification this is e.g. measured by the difference in water contact angle (WCA) between the irradiated and non-irradiated areas. For an antifouling-inducing surface modification this is e.g. measured by the difference in protein and/or cell adsorption between the irradiated and non-irradiated areas. This could for instance be done by contacting both areas with fluorescently labeling proteins and measure (after a thorough washing with buffer solution) the fluorescence intensity (of the adsorbed proteins) on the irradiated and non-irradiated areas. For an bio-immobilization-inducing surface modification this is e.g. measured by the amount of biomolecules that can be immobilized between the irradiated and non-irradiated areas. This could for instance be done by using fluorescently labeled protein for bio-immobilization and measure (after thorough washing with buffer solution) the fluorescence intensity (of the immobilized proteins) on the irradiated and non-irradiated areas.

2) (lateral) resolution—distance over which the effectiveness of the surface modification changes from maximum to minimum value, i.e. 'sharpness' of the interface between irradiated and non-irradiated areas. The sharpness could be measured by AFM topography measurements or high resolution SEM measurements.

The higher number of silicon hydrides in the hydrosilane leads to a shorter reaction time. The number of silicon hydrides in the hydrosilane influences the (chemical) contrast.

In some embodiments, one of Ra, Rb, Rc, and Rd is H. This is suitable when less dense surface modification layer and good contrast are of primary importance, while the reaction time may be longer than where other hydrosilanes are used.

In some embodiments, two of $R^a$, $R^b$, $R^c$, and $R^d$ are H. This is suitable when a good balance of a short reaction time and a good contrast is of primary importance.

In some embodiments, three of $R^a$, $R^b$, $R^c$, and $R^d$ are H. This is suitable when a short reaction time is of primary importance. The higher intrinsic reactivity may cause also some undesired reaction in the non-irradiated areas and hence the contrast may be lower than where e.g. dihydrosilanes are used.

Surface-Modifying Composition

The hydrosilane may be contacted with the surface of the solid material without prior mixing with another component or in the form of a surface-modifying composition comprising the hydrosilane and one or more other components. If the hydrosilane is contacted with the surface in the form of a surface-modifying composition, the amount of the hydrosilane in the surface-modifying composition may be selected within a broad range, for example 0.1-99.9 vol %, 1-99 vol %, 10-90 vol %, 25-75 vol % or 40-60 vol %, of the surface-modifying composition (at 20° C.). The hydrosilane may be the major component of the surface-modifying composition, e.g. the amount of the hydrosilane in the surface-modifying composition may be at least 50 vol % and less than 100 vol %, for example 50-99.9 vol %, for example 60-95 vol % or 70-90 vol %, of the surface-modifying composition. It is also possible that the surface-modifying compound is not the major component of the surface-modifying composition, e.g. the amount of the surface-modifying compound in the surface-modifying composition is less than 50 vol % and more than 0 vol %, for example 0.1-49.9 vol %, for example 5-40 vol % or 10-30 vol %, of the surface-modifying composition.

The amount of the hydrosilane or the surface-modifying composition to be used in the process according to the invention is selected to be sufficient to cover the surface to be irradiated.

The process according to the invention results in the formation of a surface modification layer on the surface of the solid material. The surface modification layer may have a thickness in the range of 0.1 nm to 100 µm, for example 1 nm to 10 µm or 10 nm to 1 µm.

The surface modifying composition can be contacted with the solid material by different deposition methods, e.g. pipetting, dipcoating, spraycoating, or spincoating.

The surface-modifying composition may comprise a photoinitiator as described above. The amount of the photoinitiator in the composition may be in the range of 0 to 5.0 wt. %, more preferably in the range of 0.001 to 1 wt. %, even more preferably in the range of 0.01 to 0.2 wt. %, and in particular in the range of 0.01 to 0.1 wt. %, relative to the surface-modifying composition.

The surface-modifying composition may comprise a suitable inert solvent. In this case, the amount of the solvent in the surface-modifying composition may be selected within a broad range, for example 0.5-99.5 vol %, 10-90 vol % or 25-75 vol %, of the surface-modifying composition.

The surface-modifying composition may comprise a compound that is reactive towards the hydrosilane. The compound reactive towards the hydrosilane may e.g. be an alcohol, thiol, alkene, alkyne, (meth)acrylate, epoxy or (meth)acrylamide, preferably having a group selected from the list A described with respect to the hydrosilanes (substituents 100-194). In this case, the amount of such compound may be selected within a broad range, for example 0.5-99.5 vol %, 10-90 vol % or 25-75 vol %, of the surface-modifying composition. The addition of such a compound during the irradiation may speed up the reaction and/or limit the reaction to occur inside of the irradiated area. This is particularly advantageous in increasing the contrast and the resolution. The addition of such a compound during irradiation may also increase the thickness of the surface modification layer and/or may influence the porosity of the surface modification layer.

The compound reactive towards the surface-modifying compound may have an end-group/functionality which may be similar to or different from that of the hydrosilane. In these embodiments, the surface modification layer may have a thickness in the range of 1 nm to 100 µm.

The surface-modifying composition may comprise microparticles and/or nanoparticles. Preferably, the microparticles and nanoparticles have a number average diameter of 0.1 nm to 10 µm, 1 nm to 1 µm or 10 nm to 100 nm, as determined according to SEM.

The micro- and nanoparticles can have Si—OH or C—OH termination or being modified with compounds reactive towards the surface-modifying compound.

The amount of such particles may be selected within a broad range, for example 0.1-99.9 wt. %, 10-90 wt % or 25-75 wt. %, of the surface-modifying corn position.

Accordingly, the surface-modifying compound may be contacted with the surface in the form of a surface-modifying composition comprising the surface-modifying compound and one or more of a photoinitiator, a suitable inert solvent, a compound that is reactive towards the surface-modifying compound and microparticles and/or nanoparticles.

The present invention further provides the surface-modified solid material obtained by or obtainable by the process of the invention.

The present invention further provides an article comprising the surface-modified solid material according to the invention. Optionally, the article has micro- or nanostructures.

Preferred examples of the article according to the invention include a substrate for biochip applications such as microarray applications and cell culture applications; a microfluidic device such as a lab-on-a-chip device or an organ-on-a-chip device.

It is noted that the invention relates to all possible combinations of features described herein, preferred in particular are those combinations of features that are present in the claims. It will therefore be appreciated that all combinations of features relating to the composition according to the invention; all combinations of features relating to the process according to the invention and all combinations of features relating to the composition according to the invention and features relating to the process according to the invention are described herein.

It is further noted that the term 'comprising' does not exclude the presence of other elements. However, it is also to be understood that a description on a product/composition comprising certain components also discloses a product/composition consisting of these components. The product/composition consisting of these components may be advantageous in that it offers a simpler, more economical process for the preparation of the product/composition. Similarly, it is also to be understood that a description on a process comprising certain steps also discloses a process consisting of these steps. The process consisting of these steps may be advantageous in that it offers a simpler, more economical process.

When values are mentioned for a lower limit and an upper limit for a parameter, ranges made by the combinations of the values of the lower limit and the values of the upper limit are also understood to be disclosed.

The invention is now elucidated by way of the following examples, without however being limited thereto.

EXAMPLES

Surface Modification

Samples were cleaned by rinsing and ultrasonication in an appropriate solvent. The sample was placed on a custom-made sample holder and a volume of surface-modifying composition was deposited on the surface. Then, the sample was covered by a photomask, resulting in a uniform liquid film between the sample and the photomask. To demonstrate the principle of photochemical surface modification a very simple photomask was used with which half of the sample is irradiated, and the other half is not. Next, the sample was irradiated with UV light at an intensity of 10-15 mW/cm$^2$, using a collimated light source. After completion of the reaction samples were rinsed to remove the excess of the surface-modifying composition and ultrasonicated with a suitable solvent. Finally, samples were dried in a stream of nitrogen.

Surface Characterization

Samples were analyzed by static water contact angle (WCA) measurements using a Krüss DSA-100 goniometer. Using the automated dispensing unit, 3 µL water droplets were deposited on the surface, images were captured using a digital camera and analyzed using a suitable fitting algorithm, depending on the wettability of the surface.

Example 1

Hydrophilic Surface Modification of Polycarbonate

The purpose of this experiment is to apply a hydrophilic surface modification to polycarbonate, i.e. to achieve a significant decrease of the water contact angle (WCA).

A polycarbonate sample was cleaned by rinsing and ultrasonication in isopropanol. A solution of 5 vol % (2,4,6,8)-tetramethylcyclotetrasiloxane (TMCTS, see below), 45 vol % poly(ethylene glycol) methyl ether acrylate (PEG-Acr, see below) and 50 vol % isopropanol was deposited onto the surface.

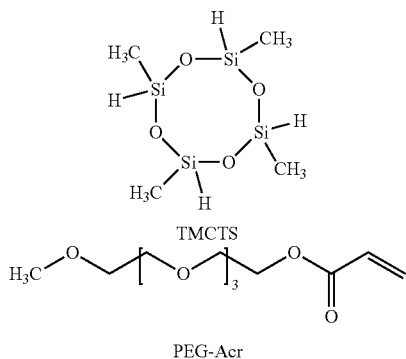

TMCTS

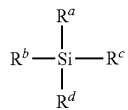

PEG-Acr

After completion of the reaction and cleaning of the sample, it was analyzed by measurement of WCA. The illuminated side of the sample has a WCA of 43°, a normal value for a PEG-modified surface. The non-illuminated side has a WCA of 75°, similar to the WCA of untreated polycarbonate. This result demonstrates that photochemical surface modification of polycarbonate has taken place and has resulted in a more hydrophilic surface.

In this example, no surface activation by $O_2$ plasma was done before surface modification, so no hydroxyl groups were created at the surface. Polycarbonate itself does not have any C—OH groups. Still the surface is successfully modified, indicating that the presence of C—OH groups on the surface is not a requirement for photochemical surface modification with hydrosilanes.

What is claimed is:

1. A process for the modification of a surface of a solid material, comprising the step of:
   contacting the surface with a surface-modifying composition under irradiation with light of a wavelength in the range of 200 to 800 nm, optionally in the presence of a photoinitiator, wherein the solid material is selected from the group consisting of polyesters, polyethers, polycarbonates, polyketones polyamides, polyurethanes, (meth)acrylate and (meth)acrylamide polymers and polyetherimides, and wherein the surface modifying composition comprises at least a hydrosilane, wherein the hydrosilane has at least one hydrosilyl group and is presented by the formula $$R^b\!-\!\underset{\underset{R^d}{|}}{\overset{\overset{R^a}{|}}{Si}}\!-\!R^c$$

wherein at least one of $R^a$, $R^b$, $R^c$, and $R^d$ is H and at least one of $R^a$, $R^b$, $R^c$, and $R^d$ is not H,
wherein each of $R^a$, $R^b$, $R^c$, and $R^d$ is, independently, H, optionally substituted $C_{1-30}$ alkyl, optionally substituted $C_{2-30}$ alkenyl, optionally substituted $C_{2-30}$ alkynyl, optionally substituted $C_{6-20}$ aralkyl, optionally substituted $C_{6-10}$ aryl, or a polymeric moiety having a molecular weight of about 1000 to about 100,000; or wherein the hydrosilane has more than one hydrosilyl group, each having at least one silicon monohydride (Si—H), silicon dihydride (Si—H2) or silicon trihydride (Si—H3); and
wherein at least one hydrogen atom bonded to the silicon atom of the hydrosilane participates in a surface coupling dehydrogenation reaction with the surface of the solid material during the irradiation with light thereby resulting in the modification of the surface of the solid material.

2. The process according to claim 1, wherein the hydrosilane is contacted with the surface in the form of the surface-modifying composition further comprising one or more of a photoinitiator, a solvent, a compound that is reactive towards the hydrosilane and microparticles and/or nanoparticles.

3. The process according to claim 2, wherein the compound reactive towards the hydrosilane is an alcohol, thiol, alkene, alkyne, (meth)acrylate, epoxy or (meth)acrylamide.

4. The process according to claim 2, wherein the surface modifying composition comprises microparticles and/or nanoparticles, and wherein the microparticles and/or nanoparticles have a number average diameter of 0.1 nm to 10 μm as determined according to Scanning Electron Microscopy (SEM).

5. The process according to claim 4, wherein the microparticles and nanoparticles have a number average diameter of 1 nm to 1 μm as determined according to SEM.

6. The process according to claim 5, wherein the microparticles and nanoparticles have a number average diameter of 10 nm to 100 nm, as determined according to SEM.

7. The process according to claim 1, wherein the hydrosilane is contacted with the surface in the form of the surface-modifying composition comprising the hydrosilane and a compound that is reactive towards the hydrosilane, wherein the amount of the compound that is reactive towards the hydrosilane in the surface-modifying composition is 50-99.9 vol % of the surface-modifying composition.

8. The process according to claim 7, wherein the amount of the compound that is reactive towards the hydrosilane in the surface-modifying composition is 60-95 vol % of the surface-modifying composition.

9. The process according to claim 8, wherein the amount of the compound that is reactive towards the hydrosilane in the surface-modifying composition is 70-90 vol % of the surface-modifying composition.

10. The process according to claim 1, wherein the photoinitiator is in the range of 0 to 5.0 wt.% relative to the surface-modifying composition.

11. The process according to claim 10, wherein the photoinitiator is in the range of 0.001 to 1 wt. % relative to the surface-modifying composition.

12. The process according to claim 11, wherein the photoinitiator is in the range of 0.01 to 0.2 wt. % relative to the surface-modifying composition.

13. The process according to claim 12, wherein the photoinitiator is in the range of 0.01 to 0.1 wt. % relative to the surface-modifying composition.

14. The process according to claim 1, wherein the process comprises the step of treating the surface to have micro- and/or nanoscale surface roughness before the irradiation step.

15. The process according to claim 14, wherein the surface is treated by casting (nano)particle solutions, sol-gel processes, or chemical vapor deposition (CVO) to prepare roughness in the order of micro- and nanometers on the surface.

16. The process according to claim 1, wherein each of $R^a$, $R^b$, $R^c$, and $R^d$ is optionally substituted with one or more substituents selected from the group consisting of —F, —Cl, —Br, —CN, —NO$_2$, =O, —N=C=O, —N=C=S, epoxy, thioether, —N$_3$, —NR$^e$R$^f$, —SR$^g$, —OR$^h$, —CO$_2$R$^i$, —PR$^j$R$^k$R$^l$, —P(OR$^m$) (OR$^n$) (OR$^p$), —P(=) (OR$^q$) (OR$^s$), —P(=O)$_2$OR$^t$, —OP(=O)$_2$OR$^u$, —S(=O)$_2$R$^v$, —S(=O) R$^w$, —S(=O)$_2$OR$^x$, and —C(=O)NR$^y$R$^z$, wherein each of R$^e$, R$^f$, R$^g$, R$^h$, R$^i$, R$^j$, R$^k$, R$^l$, R$^m$, R$^n$, R$^p$, R$^q$, R$^s$, R$^t$, R$^u$, R$^v$, R$^w$, R$^x$, R$^y$, and R$^z$, is, independently, H, linear C$_{1-10}$ alkyl, branched C$_{1-10}$ alkyl, cyclic C$_{3-8}$ alkyl, linear C$_{2-10}$ alkenyl, branched C$_{2-10}$ alkenyl, linear C$_{2-10}$ alkynyl, branched C$_{2-10}$ alkynyl, C$_{6-12}$ aralkyl, or C$_{6-10}$ aryl, and is optionally substituted with one or more substituents selected from the group consisting of —F, —Cl, and —Br.

17. The process according to claim 1, wherein the hydrosilane includes compounds represented by

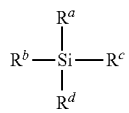

wherein at least one of $R^a$, $R^b$, $R^c$, and $R^d$ is H, at least one of $R^a$, $R^b$, $R^c$, and $R^d$ is a group represented by the formula selected from the following list A and the remaining $R^a$, $R^b$, $R^c$, and $R^d$ is, independently, optionally substituted C$_{2-30}$ alkynyl, optionally substituted C$_{6-20}$ aralkyl, optionally substituted C$_{6-10}$ aryl, or a polymeric moiety having a molecular weight of about 1000 to about 100,000, wherein the list A consists of:

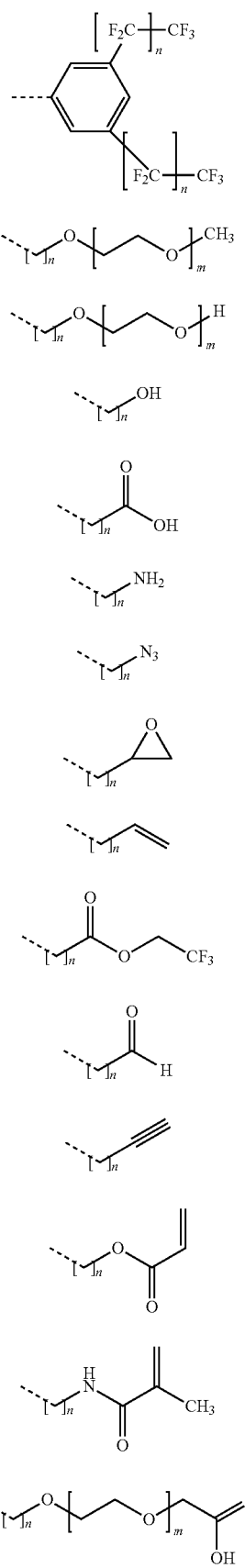

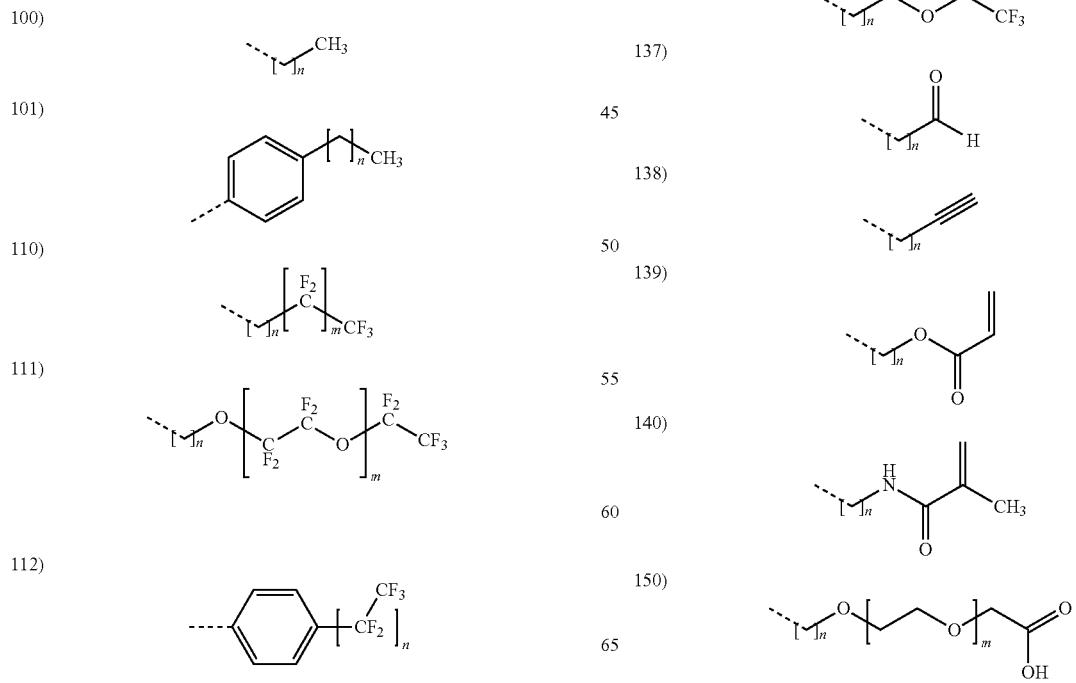

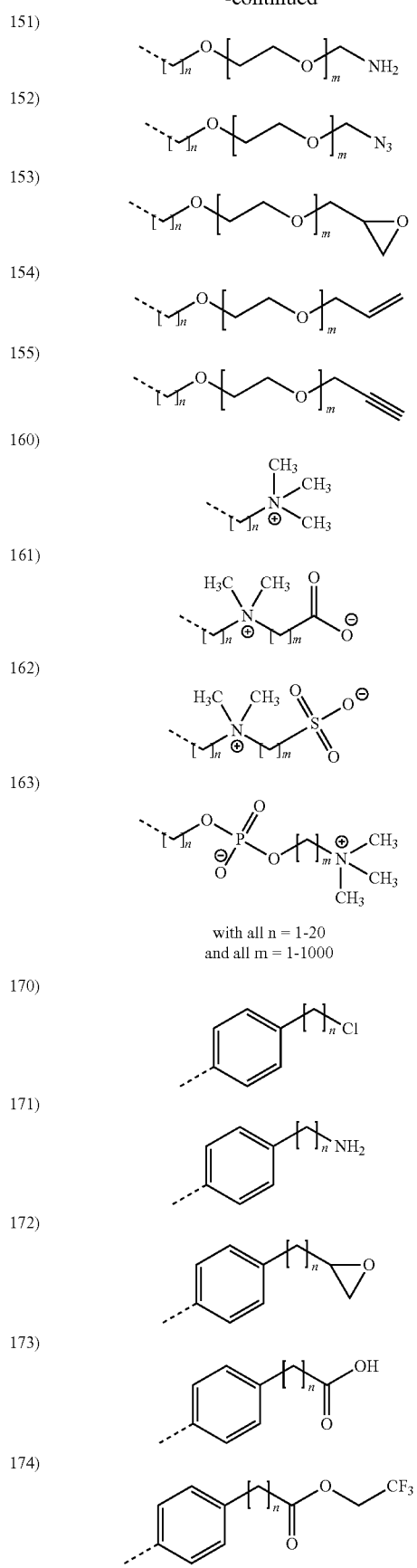
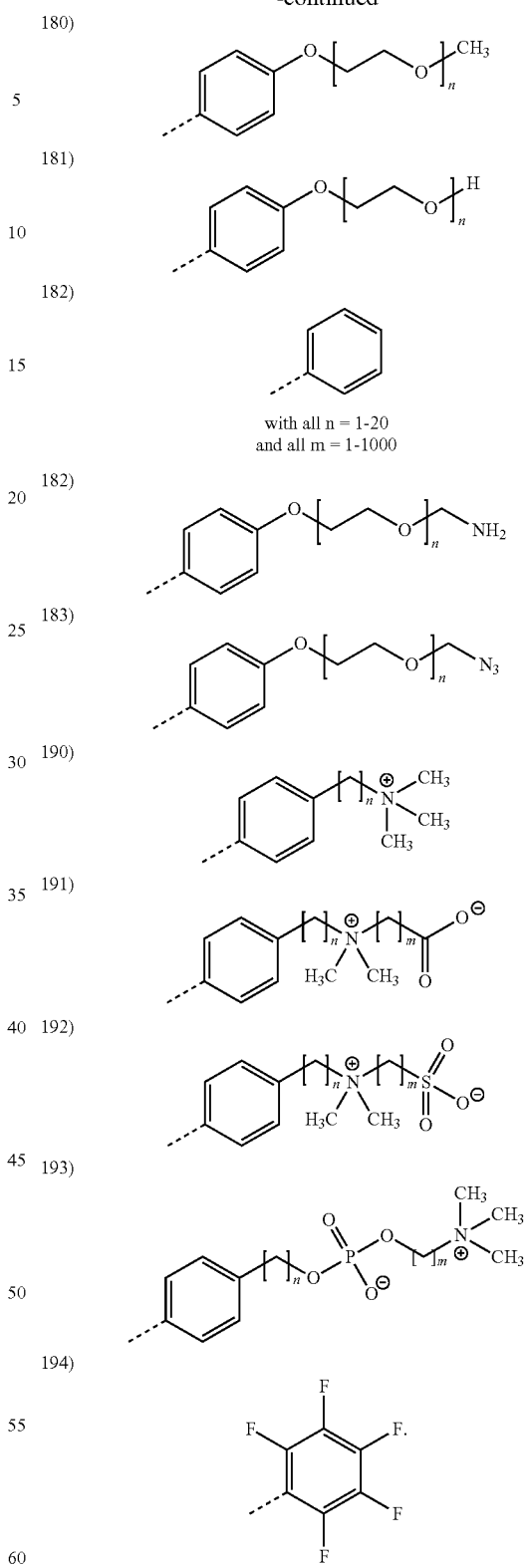
18. The process according to claim 1, wherein the hydrosilane is a compound having multiple hydrosilyl groups and is selected from the group consisting of octakis(hydrodimethylsiloxy)octasilsesquioxane and the compounds represented by structures 200)-263):

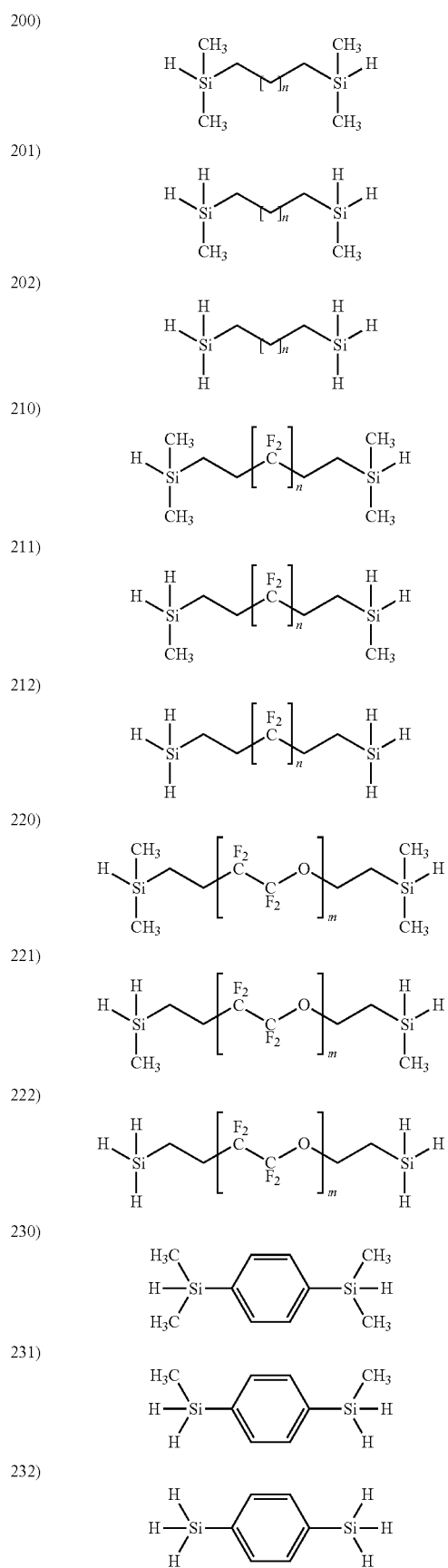
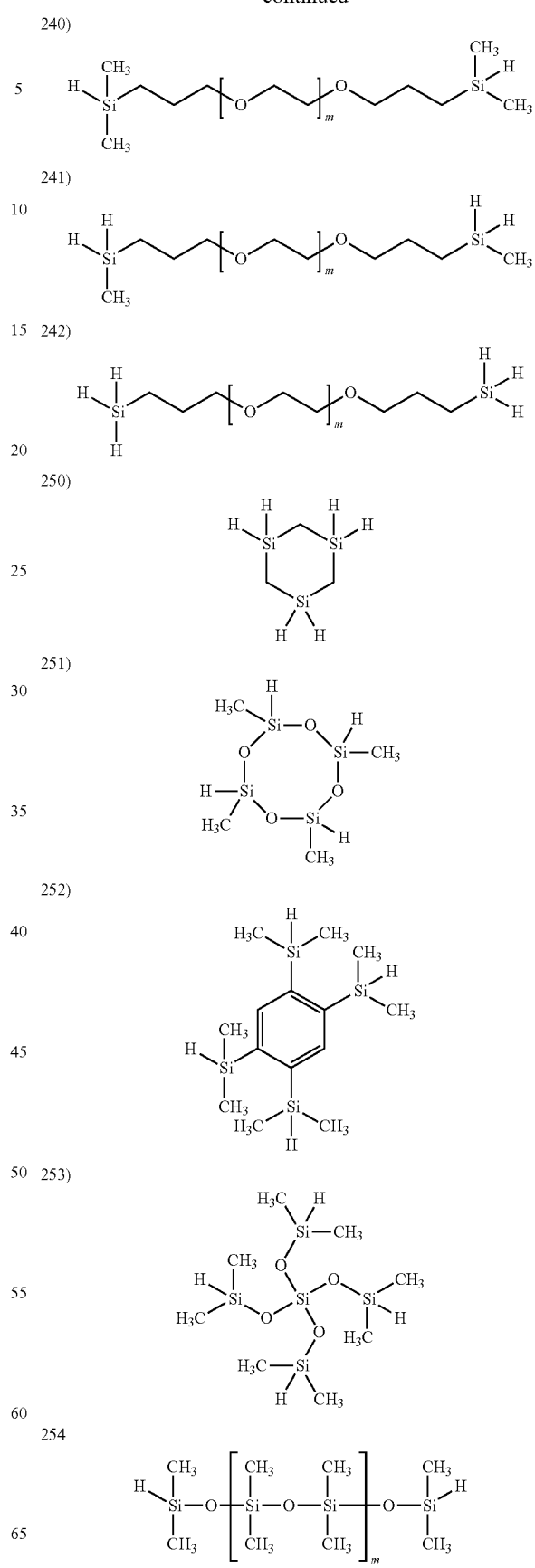

255) 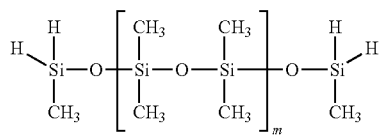

256 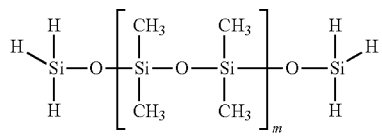

with all n = 1-20
and all m = 1-1000

260) 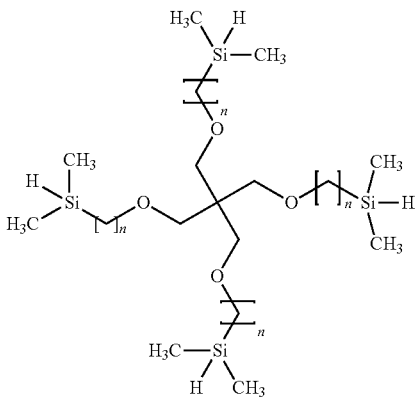

with all n = 1-20
and all m = 1=1000

261) 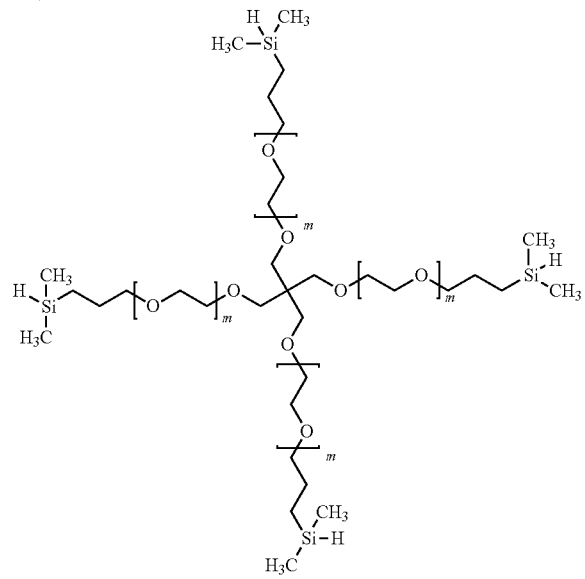

262) 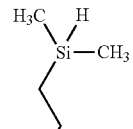

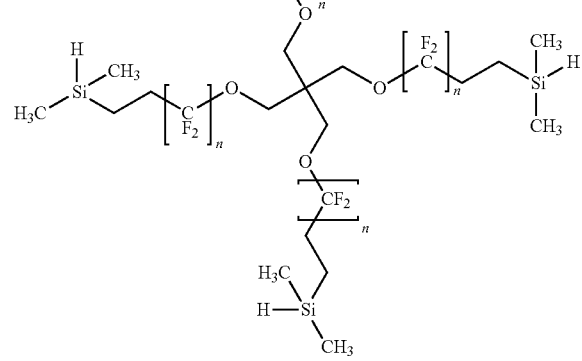

263) 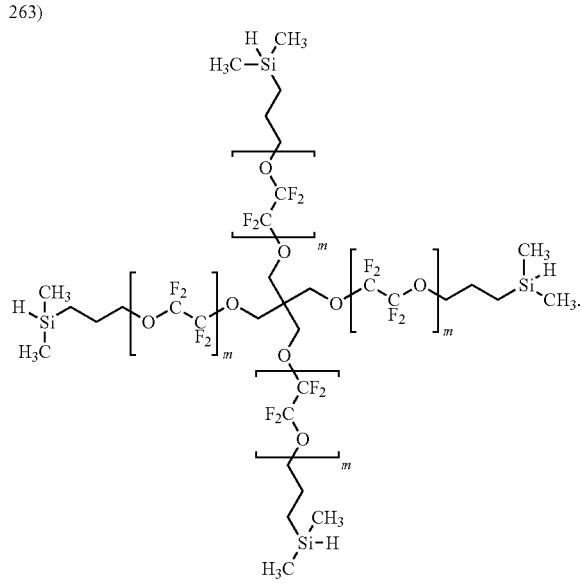

19. An article comprising the surface-modified solid material obtainable in the process according to claim 1.

20. The article according to claim 19, wherein the article includes a substrate for biochip applications or a microfluidic device.

21. The article according to claim 20, wherein the biochip applications are microarray applications or cell culture applications.

22. The article according to claim 20, wherein the microfluidic device is a lab-on-a-chip device or an organ-on-a-chip device.

* * * * *